United States Patent
Lien et al.

(10) Patent No.: US 9,836,349 B2
(45) Date of Patent: Dec. 5, 2017

(54) METHODS AND SYSTEMS FOR DETECTING AND CORRECTING ERRORS IN NONVOLATILE MEMORY

(71) Applicant: Winbond Electronics Corp., Taichung (TW)

(72) Inventors: Chuen-Der Lien, Los Altos Hills, CA (US); Ming-Huei Shieh, Cupertino, CA (US); Chi-Shun Lin, Fremont, CA (US)

(73) Assignee: Winbond Electronics Corp., Taichung (TW)

( * ) Notice: Subject to any disclaimer, the term of this patent is extended or adjusted under 35 U.S.C. 154(b) by 88 days.

(21) Appl. No.: 14/724,899

(22) Filed: May 29, 2015

(65) Prior Publication Data

US 2016/0350178 A1    Dec. 1, 2016

(51) Int. Cl.
| | |
|---|---|
| *G06F 11/10* | (2006.01) |
| *G11C 11/00* | (2006.01) |
| *G11C 13/00* | (2006.01) |
| *G11C 29/04* | (2006.01) |
| *G11C 29/24* | (2006.01) |

(Continued)

(52) U.S. Cl.
CPC ...... *G06F 11/1068* (2013.01); *G06F 11/1048* (2013.01); *G11C 11/005* (2013.01); *G11C 13/0004* (2013.01); *G11C 13/0033* (2013.01); *G11C 29/24* (2013.01); *G11C 29/42* (2013.01); *G11C 29/44* (2013.01); *G11C 29/50004* (2013.01); *G11C 29/52* (2013.01);

(Continued)

(58) Field of Classification Search
CPC .............. G11C 11/406; G11C 11/4062; G11C 11/40618; G11C 2029/0411; G11C 11/40622

USPC .......................................................... 714/764
See application file for complete search history.

(56) References Cited

U.S. PATENT DOCUMENTS

| | | | |
|---|---|---|---|
| 6,704,230 B1 | 3/2004 | DeBrosse et al. | |
| 7,477,547 B2 * | 1/2009 | Lin | G06F 11/106 |
| | | | 365/185.09 |

(Continued)

FOREIGN PATENT DOCUMENTS

| | | |
|---|---|---|
| KR | 10-2010-0068923 | 6/2010 |
| WO | WO 2008/118705 A1 | 10/2008 |
| WO | WO 2011/022123 A1 | 2/2011 |

OTHER PUBLICATIONS

Extended European Search Report dated Nov. 2, 2016, in European Application No. 16160734.6.

*Primary Examiner* — James C Kerveros
(74) *Attorney, Agent, or Firm* — Finnegan, Henderson, Farabow, Garrett & Dunner LLP

(57) ABSTRACT

A memory system includes a resistive nonvolatile memory array configured to store data and error correction code (ECC) bits and a memory controller. The memory controller is configured to detect a number of errors among the stored look-ahead bits, compare the number of look-ahead bit errors to a threshold number of bit errors, perform a strong refresh of the data and look-ahead bits stored in the resistive nonvolatile memory array when the number of look-ahead bit errors equals or exceeds the threshold, and perform a weak refresh of the data and look-ahead bits by refreshing only units of stored data having data bit errors and look-ahead bits having look-ahead bit errors when the number of look-ahead bit errors is less than the threshold.

23 Claims, 9 Drawing Sheets

(51) Int. Cl.
*G11C 29/42* (2006.01)
*G11C 29/44* (2006.01)
*G11C 29/50* (2006.01)
*G11C 29/52* (2006.01)
*G11C 7/04* (2006.01)

(52) U.S. Cl.
CPC ........ *G11C 7/04* (2013.01); *G11C 2029/0407* (2013.01); *G11C 2029/0411* (2013.01)

(56) References Cited

U.S. PATENT DOCUMENTS

| | | | |
|---|---|---|---|
| 7,836,374 B2 * | 11/2010 | Klein | G11C 7/20 |
| | | | 714/754 |
| 7,877,657 B1 | 1/2011 | Miller et al. | |
| 7,894,277 B2 | 2/2011 | Lee et al. | |
| 7,894,289 B2 * | 2/2011 | Pawlowski | G06F 11/1044 |
| | | | 365/222 |
| 7,900,120 B2 * | 3/2011 | Pawlowski | G06F 11/1044 |
| | | | 714/764 |
| 8,028,211 B1 | 9/2011 | Miller et al. | |
| 8,677,216 B2 | 3/2014 | Park et al. | |
| 8,760,920 B2 * | 6/2014 | Kim | G11C 13/0002 |
| | | | 365/148 |
| 9,076,549 B2 * | 7/2015 | Kim | G11C 11/40618 |
| 2006/0039196 A1 | 2/2006 | Gorobets et al. | |
| 2008/0212352 A1 | 9/2008 | Oh et al. | |
| 2009/0201729 A1 | 8/2009 | Song et al. | |
| 2010/0153628 A1 | 6/2010 | Jang et al. | |
| 2012/0099389 A1 * | 4/2012 | Park | G11C 11/40618 |
| | | | 365/200 |
| 2013/0268717 A1 | 10/2013 | Scouller et al. | |
| 2013/0336047 A1 | 12/2013 | Hokenmaier | |
| 2014/0089563 A1 | 3/2014 | Wu et al. | |
| 2014/0101519 A1 | 4/2014 | Lee et al. | |
| 2014/0146624 A1 * | 5/2014 | Son | G11C 29/4401 |
| | | | 365/200 |
| 2014/0229655 A1 | 8/2014 | Goss et al. | |
| 2014/0281311 A1 | 9/2014 | Walker et al. | |
| 2015/0049538 A1 | 2/2015 | Okubo et al. | |
| 2015/0194201 A1 * | 7/2015 | Kim | G11C 11/1695 |
| | | | 714/763 |
| 2015/0348624 A1 * | 12/2015 | Jang | G11C 13/004 |
| | | | 365/148 |
| 2015/0364190 A1 * | 12/2015 | Aue | G11C 13/0033 |
| | | | 365/148 |
| 2016/0005452 A1 * | 1/2016 | Bae | G11C 29/24 |
| | | | 714/764 |
| 2016/0098216 A1 * | 4/2016 | Huang | G06F 11/1072 |
| | | | 714/37 |
| 2016/0110249 A1 * | 4/2016 | Orme | G06F 3/0619 |
| | | | 714/6.24 |

* cited by examiner

METHODS AND SYSTEMS FOR DETECTING AND CORRECTING ERRORS IN NONVOLATILE MEMORY

TECHNICAL FIELD

The present disclosure generally relates to nonvolatile memory. More specifically, and without limitation, the example embodiments described herein relate to methods and systems for detecting and correcting errors in nonvolatile memory.

BACKGROUND

Nonvolatile semiconductor memories generally retain stored data even when not powered. Transistor-based nonvolatile memories, such as flash memory and electrically erasable programmable read-only memory (EEPROM), offer fast read access times and shock resistance making them desirable in various applications. Some applications of nonvolatile memories include data storage on computing devices, mobile phones, portable audio players, and other consumer electronic products.

FIG. 1 illustrates a circuit diagram of an example transistor-based nonvolatile memory array 100. Transistor-based nonvolatile memory array 100 includes a plurality of transistor-based nonvolatile memory cells 110. Each transistor-based nonvolatile memory cell 110 is associated with a word line (e.g., WL0 through WLn) and a bit line (e.g., BL0 through BLm). Transistor-based nonvolatile memory array 100 may be formed by nonvolatile memories that store data using one or more transistors as a storage element. Transistor-based nonvolatile memories include programmable read-only memory (PROM), electrically programmable read-only memory (EPROM), EEPROM memory, flash memory, or eFUSE memory.

As shown in FIG. 1, when transistor-based nonvolatile memory array 100 is implemented using EPROM, EEPROM, or flash memory, each transistor-based nonvolatile memory cell 110 includes a floating-gate metal-oxide semiconductor field-effect transistor (MOSFET). The floating-gate MOSFET (FGMOS) can store charge in an electrically isolated floating gate. The electrical isolation allows the floating gate to retain a charge for extended periods of time without power. A fully charged floating gate may represent a logical "0" state and an uncharged floating gate may represent a logical "1" state, or vice-versa.

Emerging nonvolatile memory technologies are being developed to address various limitations associated with transistor-based nonvolatile memories such as flash memory. For example, most commercially available flash memories suffer from relatively low write endurance. A typical flash memory may be capable of enduring up to $1 \times 10^5$ write cycles (also referred to as program/erase cycles); whereas some emerging nonvolatile memories, such as magnetic random access memory (MRAM), may be capable of enduring up to $1 \times 10^{12}$ write cycles. As another example, flash memory arrays may suffer from scaling issues such as read disturb (sequential read cycles that cause nearby cells to change over time) and reductions in write endurance.

Emerging nonvolatile memories, however, have shortcomings. For example, high operating temperatures may cause data errors such as flipped bits in some emerging nonvolatile memories such as resistive nonvolatile memories. Such data errors may lead to system crashes, data corruption, and/or security vulnerabilities. Moreover, subjecting emerging nonvolatile memories to high manufacturing and storage temperatures may cause data retention issues such as systematic data drift, data loss, significant data corruption, and decreased data retention times.

SUMMARY

In accordance with one example embodiment, a memory system includes a resistive nonvolatile memory array configured to store data and look-ahead bits and a memory controller. The memory controller is configured to determine a number of errors among the stored look-ahead bits, compare the number of look-ahead bit errors to a threshold number of bit errors, perform a strong refresh of the data and look-ahead bits stored in the resistive nonvolatile memory array when the number of look-ahead bit errors equals or exceeds the threshold, and perform a weak refresh of the data and look-ahead bits by refreshing only units of stored data having data bit errors and look-ahead bits having look-ahead bit errors when the number of look-ahead bit errors is less than the threshold.

In accordance with another example embodiment, a method for correcting errors in a memory system includes detecting a number of errors among look-ahead bits stored in a resistive nonvolatile memory array, comparing the number of look-ahead bit errors to a threshold number of bit errors, performing a strong refresh of the data and look-ahead bits stored in the resistive nonvolatile memory array when the number of look-ahead bit errors equals or exceeds the threshold, and performing a weak refresh of the data and look-ahead bits by refreshing only units of stored data having data bit errors and look-ahead bits having look-ahead bit errors when the number of look-ahead bit errors is less than the threshold.

In accordance with yet another example embodiment, a memory system includes a nonvolatile memory array. The nonvolatile memory array includes resistive memory cells configured to store data, resistive memory cells configured to store error correction code (ECC) bits, the ECC bits for correcting data bit errors in units of the stored data, and resistive memory cells configured to store look-ahead bits, the look-ahead bits for detecting systematic drift of the stored data.

Before explaining certain embodiments of the present disclosure in detail, it is to be understood that the disclosure is not limited in its application to the details of construction and to the arrangements of the components set forth in the following description or illustrated in the drawings. The disclosure is capable of embodiments in addition to those described and of being practiced and carried out in various ways. Also, it is to be understood that the phraseology and terminology employed herein, as well as in the abstract, are for the purpose of description and should not be regarded as limiting.

As such, those skilled in the art will appreciate that the conception and features upon which this disclosure is based may readily be utilized as a basis for designing other structures, methods, and systems for carrying out the several purposes of the present disclosure. Furthermore, the claims should be regarded as including such equivalent constructions insofar as they do not depart from the spirit and scope of the present disclosure.

BRIEF DESCRIPTION OF THE DRAWINGS

The accompanying drawings, which are incorporated in and constitute part of this specification, and together with the description, illustrate and serve to explain the principles of various exemplary embodiments.

DETAILED DESCRIPTION OF EXAMPLE EMBODIMENTS

Figure 1:
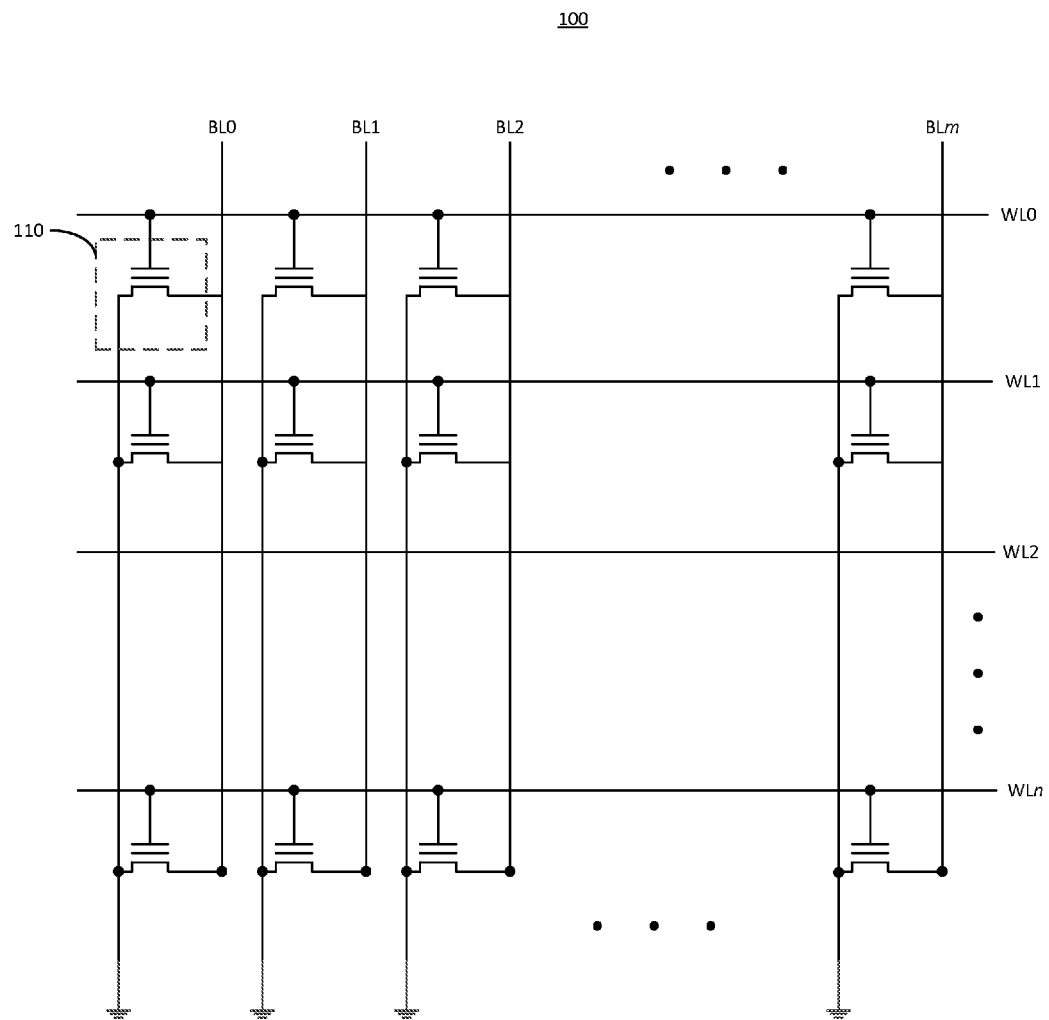
FIG. 1 is a circuit diagram of an example transistor-based nonvolatile memory array.

Embodiments of the present disclosure provide improved methods and systems for detection and correction of errors in emerging nonvolatile memories. Many emerging nonvolatile memories have significant advantages over transistor-based nonvolatile memories in terms of write speed and endurance, power consumption, data retention, data security, and byte-level random access. However, some emerging nonvolatile memories, such as resistive nonvolatile memories, may be susceptible to data retention and corruption issues due to high temperatures and/or electromagnetic interference (EMI). Resistive nonvolatile memories may include, for example, any nonvolatile memory that uses different resistance states to store data. Examples of resistive nonvolatile memories include phase-change random access memory (PCRAM), magnetic random access memory (MRAM), programmable metallization cell (PMC) memory such as conductive-bridging random access memory (CBRAM), and resistive random access memory (RRAM).

PCRAM stores data by using differences in resistance between amorphous and crystalline phases of chalcogenide-based material. The amorphous phase corresponds to a high-resistance phase and the crystalline phase corresponds to a low-resistance phase. MRAM stores data by using a tunnel barrier layer between two ferromagnetic layers to switch between different resistance states. A low-resistance state is achieved when the magnetization directions of the two ferromagnetic layers are parallel. A high-resistance state is achieved when the magnetization directions of the two ferromagnetic layers are antiparallel. CBRAM cells include a thin film of electrolyte between two solid metal electrodes. A CBRAM cell stores data at different resistance states by forming a nanowire between the metal electrodes in the electrolyte film. The absence of the nanowire corresponds to a high-resistance state and the presence of the nanowire corresponds to a low-resistance state. RRAM stores data as two or more resistance states based on resistive switching in transition metal oxides. Similar to CBRAM cells, a RRAM cell includes a metal-insulator-metal structure. Different logic states are represented by producing a trail of conducting defects (referred to as a "filament") in the insulator layer. The absence of the filament corresponds to a high-resistance state and the presence of the filament corresponds to a low-resistance state. Respective high and low resistance states of the various resistive memories serve to store data representing first and second logical values, e.g., "0" and "1".

Nonvolatile memories may be rated to operate within various temperature ranges. For example, a nonvolatile memory may be rated to operate within ambient temperatures of 0 to 85° C. (commercial rated), −40 to 125° C. (industrial/automotive rated), or −55 to 125° C. (military rated). Storage temperature ratings typically range up to 150° C. Nonvolatile memories may also experience high temperatures during IC board mount. For example, a typical wave solder process may reach temperatures up to 250° C. Resistive nonvolatile memories may experience degraded performance near the upper portions of these operating ranges. For example, data errors such as bit flipping may occur in resistive nonvolatile memory cells at high ambient operating temperatures. Moreover, data written to a resistive nonvolatile memory before exposure to a high temperature, such as caused by a wave soldering process, may experience significant data errors such as systematic data drift and decreased data retention times.

Embodiments of the present disclosure provide improvements in high-temperature memory operation and data retention in resistive nonvolatile memories, thereby enabling performance improvements in systems and/or integrated circuits (ICs) embodying such memories. Embodiments of the present disclosure provide a resistive nonvolatile memory that is configured to renew its stored data using error correction codes (ECC). Data renewal is performed at various points of memory system operation, such as during a power-up initialization or idle mode, or in response to a system command. Data renewal may be performed by reading, correcting, and writing back the stored data. Some embodiments provide for an enhanced data renewal with stronger write back performed in the case of insufficient ECC bits or systematic data drift. The enhanced data renewal may refresh the entire data stored in the resistive memory so that memory margin is regained after board mount and/or high temperature storage. Other embodiments may provide combinations of data renewal techniques.

Reference will now be made in detail to the exemplary embodiments implemented according to the disclosure, the examples of which are illustrated in the accompanying drawings. Wherever possible, the same reference numbers will be used throughout the drawings to refer to the same or like parts.

Figure 2:
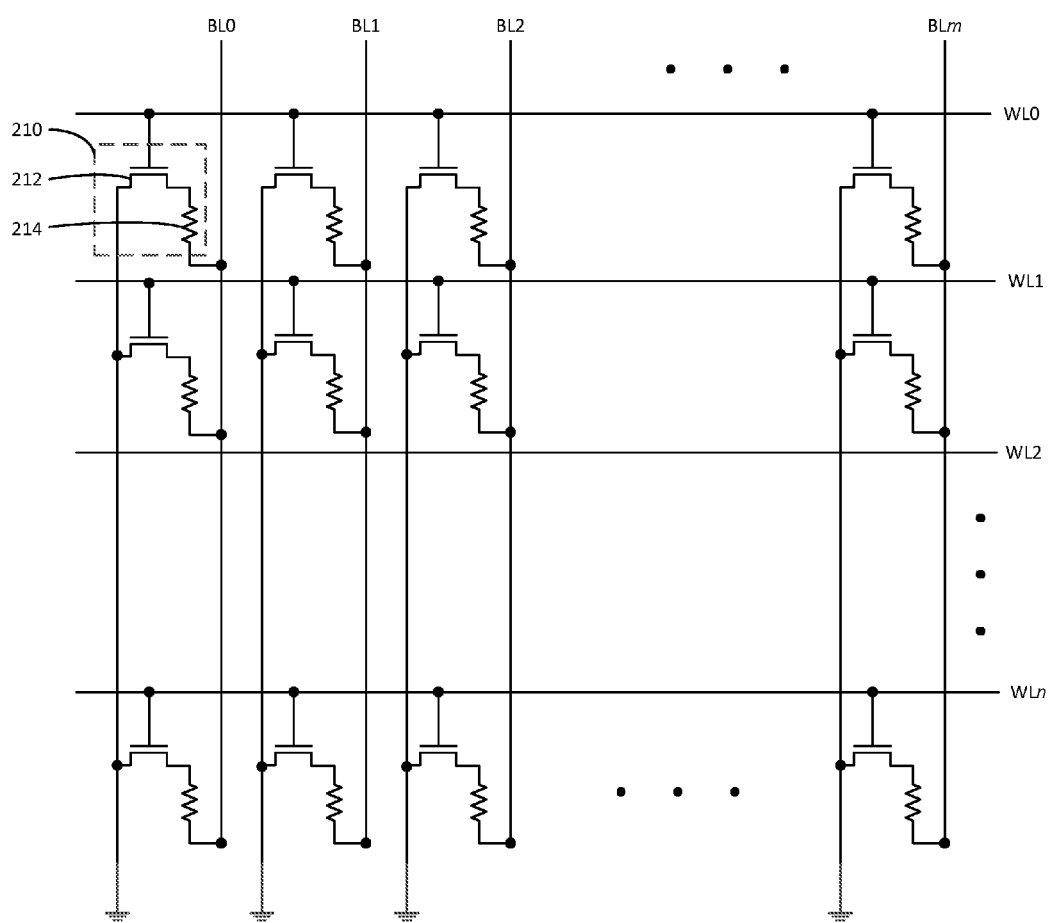
FIG. 2 is a circuit diagram of an example resistive nonvolatile memory array for implementing embodiments consistent with the present disclosure.

FIG. 2 illustrates a circuit diagram of an example resistive nonvolatile memory array 200 for implementing embodiments consistent with the present disclosure. Resistive nonvolatile memory array 200 may be formed using any of the resistive nonvolatile memories described above, such as PCRAM, RRAM, MRAM, or CBRAM. Moreover, resistive nonvolatile memory array 200 may comprise a two-dimensional memory array or a three-dimensional memory array.

As shown in FIG. 2, resistive nonvolatile memory array 200 includes a plurality word lines (WL0 through WLn), bit lines (BL0 through BLm), and resistive memory cells 210. Each resistive memory cells 210 is associated with a word line and a bit line. Each resistive memory cell 210 includes a selecting element 212 and a resistive storage element 214. Resistive memory cells 210 may be implemented by any of the resistive nonvolatile memories described above, such as a PCRAM cell, RRAM cell, MRAM cell, or CBRAM cell. Selecting element 212 behaves as a selecting switch to control access to the resistive memory cell 210. Selecting element 212 may be implemented by, for example, a diode, a metal-oxide semiconductor field-effect transistor (MOSFET), or a bipolar junction transistor (BJT). In some embodiments, selecting element 212 may be optional, for example where resistive memory cell 210 is implemented by a RRAM cell.

Figure 3:
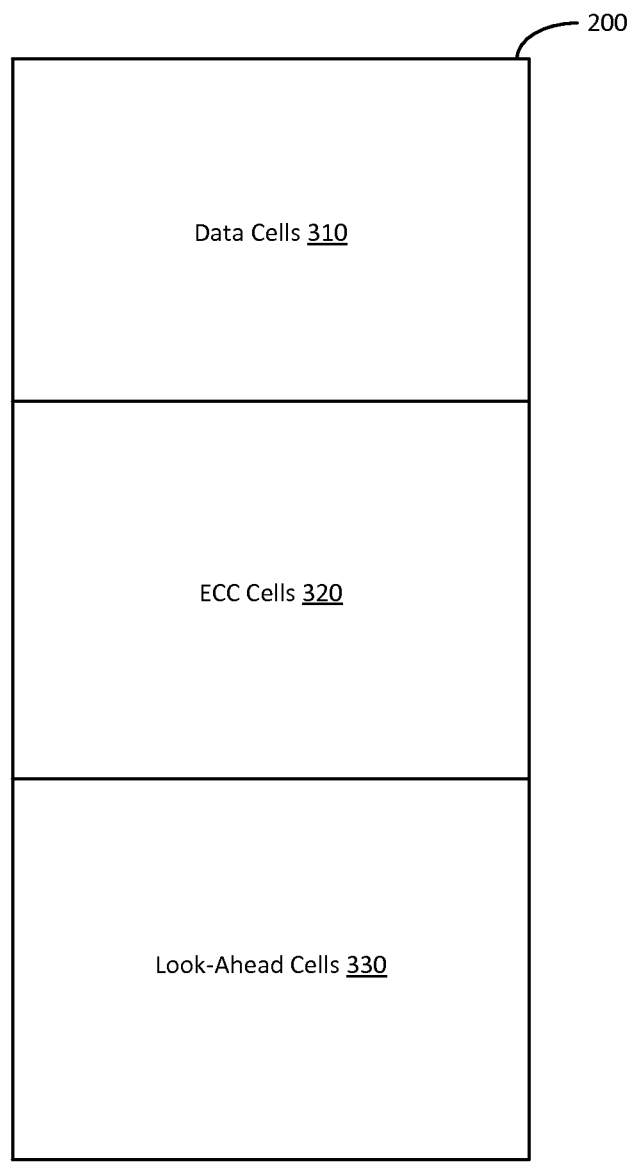
FIG. 3 is a block diagram of an example resistive nonvolatile memory array for implementing embodiments consistent with the present disclosure.

FIG. 3 illustrates a block diagram of resistive nonvolatile memory array 200 for implementing embodiments consistent with the present disclosure. As shown in FIG. 3, resistive nonvolatile memory array 200 includes a plurality of cell types. For example, data cells 310 are configured to store data bits. Each data cell 310 stores one or more data bits. The data bits may be written and accessed in various storage units, such as pages, blocks, sectors, words, or any other storage configuration known in the art. Each storage unit may comprise any number of data bits.

In some embodiments, resistive nonvolatile memory array 200 includes ECC cells 320. Each ECC cell 320 is configured to store an ECC bit (or bits) for detecting and correcting errors or defective data bits stored in data cells 310 and look-ahead cells 330. Errors may be soft errors that are caused by, for example, EMI, high-temperature operation, high-temperature storage, board mount wave solder temperatures, etc. Soft errors are typically transient and do not always repeat. Errors may be hard errors that are caused by hardware defects in the memory cell. Hard errors are typically repeatable and consistently return incorrect results. The stored ECC bits may include Hamming codes, Bose, Chaudhuri, and Hocquenghem (BCH) codes, parity bits, Reed-Solomon codes, Turbo codes, low-density parity-check codes (LDPC), convolutional codes, or any other error correction codes known in the art.

The number of ECC bits stored in ECC cells 320 depends on an ECC coding scheme. The ECC coding scheme may allocate a number of ECC bits per storage unit (e.g., per page, per block, per sector, per word, per byte, per bit, etc.) of stored data. For example, where 16 data words are stored in data cells 310 and the ECC coding scheme allocates four ECC bits per data word, the number of total ECC bits stored in ECC cells 320 is 64, one or more ECC bits per ECC cell 320. The number of ECC bits allocated to each storage unit may be flexible and may depend on design requirements, system capabilities, timing and throughput requirements, etc. The number of data bit errors correctable by the stored ECC bits is determined as i-1 where i is the number of ECC bits allocated to each storage unit. For example, where ECC cells 320 store three ECC bits per data word, the three ECC bits can correct two data bit errors per data word.

In some embodiments, resistive nonvolatile memory array 200 includes look-ahead cells 330. Look-ahead cells 330 are configured to store look-ahead bits for detecting substantial data corruption or systematic data drift of the data stored in data cells 310. Each look-ahead cell 330 is configured to store one or more look-ahead bits. The look-ahead bits stored in look-ahead cells 330 serve as indicators of data corruption or systematic drift due to, for example, EMI, board mount wave solder temperatures or high temperature storage of the resistive nonvolatile memory array 200. In other words, the presence of significant errors in the stored look-ahead bits likely indicates that data stored in data cells 310 also contains significant errors.

The number of look-ahead bits stored in look-ahead cells 330 depends on a number of factors such as the total number of memory cells included in resistive nonvolatile memory array 200, the total number of data bits stored in data cells 310, the importance of memory system reliability, the amount of memory system throughput allocable to systematic drift detection, etc. Examples of the total number of look-ahead bits stored in look-ahead cells 330 include 16 bits or 32 bits. The total number of look-ahead bits stored in look-ahead cells 330 may be small compared to the number of data bits stored in data cells 310. Accordingly, using a small number of look-ahead bits as a proxy for the quality of a large number of data bits improves memory system efficiency and reduces the amount of memory system resources needed for error detection.

In some embodiments, data cells 310, ECC cells 320, and/or look-ahead cells 330 are configured to store multiple bits per cell. For example, multi-level cells may be used in a resistive memory array 200. Multi-level cells use three or more different resistance states to store two or more data bits. For example, a multi-level cell with four different resistance states can store two bits, each bit using two resistance states to represent a logical "0" and "1". However, increasing the number of bits stored per cell may result in a greater bit error rate and thus require a greater number of ECC bits per storage unit to correct those errors.

Data cells 310, ECC cells 320, and look-ahead cells 330 may be included in the same resistive nonvolatile memory array 200, stored in different resistive nonvolatile memory arrays 200 formed on the same semiconductor die, stored in different resistive nonvolatile memory arrays 200 formed on separate semiconductor dies that are included in the same integrated circuit (IC) package, stored in different resistive nonvolatile memory arrays 200 formed on separate semiconductor dies included in separate IC packages, etc.

Figure 4:
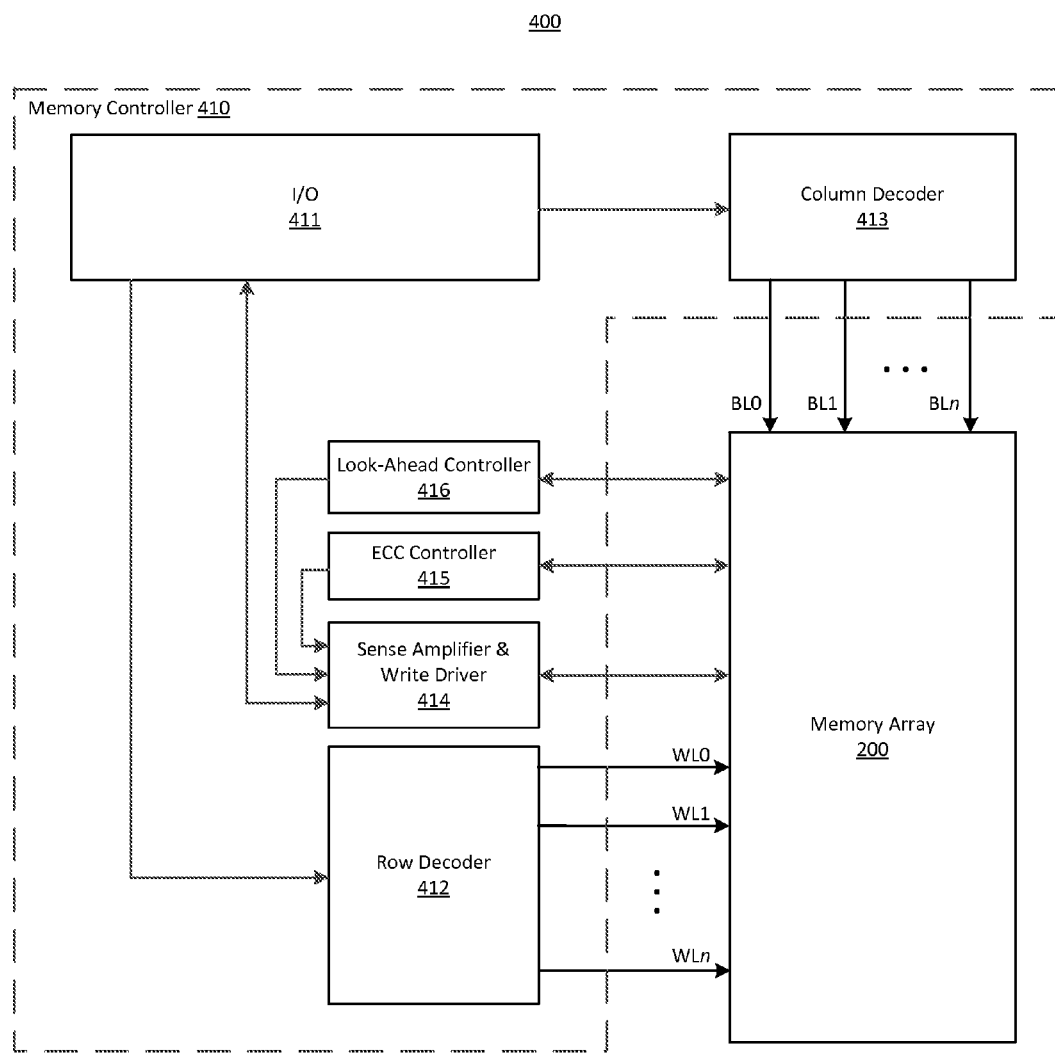
FIG. 4 is a block diagram of an example memory system for implementing embodiments consistent with the present disclosure.

FIG. 4 illustrates a block diagram of an example memory system 400 for implementing embodiments consistent with the present disclosure. As shown in FIG. 4, memory system 400 includes resistive nonvolatile memory array 200 and a memory controller 410. It will be appreciated from the present disclosure that the number and arrangement of these components is exemplary only and provided for purposes of illustration. Other arrangements and numbers of components may be utilized without departing from the teachings and embodiments of the present disclosure. As an example, memory controller 410 and resistive-based nonvolatile memory array 200 may be formed on the same semiconductor die, on separate semiconductor dies that are included the same IC package, on separate semiconductor dies included in separate IC packages, or any configuration known in the art. As another example, memory controller 410 may control multiple resistive nonvolatile memory arrays 200 or a combination of transistor-based nonvolatile memory arrays and resistive nonvolatile memory arrays 200.

In some embodiments, memory controller 410 includes an input/output interface (I/O) 411, a row decoder (also referred to as a word line decoder) 412, a column decoder 413, a sense amplifier and write driver 414, an error correction code (ECC) controller 415, and a look-ahead controller 416. Components 411-416 included in memory controller 410 may be implemented by combinations of hardware and software. For example, components 411-416 may be implemented by a microprocessor, an application specific integrated circuit (ASIC), a programmable gate array (PGA) or field-programmable gate array (FPGA), electrical circuits, or any combination thereof. Moreover, some or all of the functions of components 411-416 may be performed by the same hardware/software combination. For example, the functions of ECC controller 415 and look-ahead controller 416 may be performed by the same microprocessor, ASIC, PGA, FPGA, CPLD or custom logic circuit, and all the controllers may or may not share the same write algorithm.

I/O 411 receives input signals from external sources and converts the input signals so they may be understood and accepted by the components included in memory controller 410. For example, I/O 411 may receive commands such as read commands, write commands, data renewal comments, etc.

In a normal read operation, I/O 411 transmits row and column coordinates to row decoder 412 and column decoder 413, respectively. Row decoder 412 decodes the row coordinates and provides a sense voltage to a corresponding word line. The sense voltage activates the selection element 212 of each resistive memory cell 210 connected to the word line. Column decoder 413 decodes the column coordinates and connects a corresponding bit line to sense amplifier and write driver 414. Sense amplifier and write driver 414 includes a read circuit and a write circuit. The read circuit measures the current through the resistive memory cell 210 at the appropriate word line/bit line intersection, and determines the logic value corresponding to the measured current. During a read cycle, memory cell current is distributed on either side of a threshold current value (typically referred to as a sense current). Current values greater than the threshold value correspond to a logic "0" and current values less than the threshold value correspond to a logic "1" or vice-versa. Accordingly, sense amplifier and write driver 414 measures the current through the resistive memory cell 210, compares the measured current to one or more threshold current values, and identifies the logic value based on whether the measured current is greater or less than the threshold current value. Sense amplifier and write driver 414 provides the identified logic value to I/O 411 as output from the read operation. I/O 411 transmits the output to an external destination or holds the output until requested by an external source. In some embodiments, a plurality of resistive memory cells 210 associated with the same activated word line may be read in a single read operation. When row decoder 412 provides the sense voltage to the corresponding word line, each resistive memory cell 210 on the word line is activated. Thus, the read circuit measures current through each activated resistive memory cell 210 on the bit lines associated with those cells.

In some embodiments, memory controller 410 performs a margin read operation on memory cells 210 when greater memory reliability and read precision are desired. For example, memory controller 410 performs a margin read operation when reading from look-ahead cells 330. Since look-ahead bits serve as a proxy for the quality of a large number of data bits, a margin read is used to improve detection of degradation in look-ahead bit quality (and therefore that data corruption is imminent). As another example, memory controller 410 performs a margin read operation on data cells 310 after a strong or weak refresh operation (described below in reference to FIGS. 7 and 8) to verify that data cells 310 were successfully refreshed.

Instead of using a single threshold current value, sense amplifier and write driver 414 determines the logic value corresponding to the measured current by comparing the measured current to a plurality of threshold current values during a margin read operation. The threshold current values include an upper threshold current value and a lower threshold current value. The upper and lower threshold current values are distributed on either side of the normal threshold current value. For example, where a threshold current value of a normal write cycle is selected as 25 µA, upper and lower threshold current values may be selected as 40 µA and 10 µA, respectively. A measured current value greater than the upper threshold current value corresponds to a logic "0" and a measured current value less than the lower threshold current value corresponds to a logic "1", or vice-versa.

In normal write operation, I/O 411 receives data from an external source and a resistive memory cell 210 address where the data is to be stored. I/O 411 converts the address to row and column coordinates and sends the coordinates to row decoder 412 and column decoder 413, respectively. Row decoder 412 decodes the row coordinates and provides a write voltage to a corresponding word line. Column decoder 413 decodes the column coordinates and connects a corresponding bit line to sense amplifier and write driver 414. I/O 411 transmits instructions to sense amplifier and write driver 414 to write either a "0" or a "1" to the resistive memory cell 210 located at the intersection of the activated word line and bit line. The write circuit of sense amplifier and write driver 414 changes the resistance of resistive element 212 to a high-resistance state or low-resistance depending on whether a "1" or "0" is to be stored.

In some embodiments, memory controller 410 includes an ECC controller 415. ECC controller 415 detects data bit errors among the data stored in data cells 310 and look-ahead bit errors among the bits stored in look-ahead cells 330. In the write operation described above, ECC controller 415 generates ECC bits corresponding to data that is to be written to resistive memory cells 210. ECC controller 415 also generates ECC bits corresponding to look-ahead bits that are to be written to resistive memory cells 210. The number of ECC bits generated for each storage unit of data or look-ahead bits is determined according to one of the ECC coding schemes described above. The generated ECC bits are transmitted from ECC controller 415 to sense amplifier and write driver 415. The write circuit of sense amplifier and write driver 415 writes the data to data cells 310, the look-ahead bits to look-ahead cells 330, and the generated ECC bits to ECC cells 320.

In the read operation described above, ECC controller 415 reads data stored in data cells 310 and corresponding ECC bits stored in ECC cells 320. ECC controller 415 uses the ECC bits to perform error detection on the read data to detect data bit errors. In one embodiment, ECC controller 415 determines the number of data bit errors per storage unit of data. If the number of data bit errors per storage unit is less than the number of ECC bits corresponding to the storage unit, ECC controller 415 uses the ECC bits to correct the data bit errors. ECC controller 415 transmits the corrected data to sense amplifier and write driver 414 and the write circuit writes the data back to the respective data cells 310 and ECC cells 320. In some embodiments, the write circuit writes the entire storage unit of data, including the corrected data bits, to data cells 310. In other embodiments, the write circuit writes only the corrected bits to data cells 310.

In some embodiments, memory controller 410 includes a look-ahead controller 416. Look-ahead controller 416 detects significant data corruption and/or systematic data drift of data stored in data cells 310. For example, look-ahead controller 416 reads look-ahead bits stored in look-ahead cells 330 and corresponding ECC bits stored in ECC cells 320, and determines the number of look-ahead bit errors stored in look-ahead cells 330 using the ECC bits. If the number of look-ahead bit errors equals or exceeds a threshold number of bit errors, look-ahead controller 416 initiates a strong refresh of the data stored in data cells 310.

An example threshold number of look-ahead bit errors may be 50% of the look-ahead bits stored in look-ahead cells 330. Thus, in the present example, when there are 32 look-ahead bits stored in look-ahead cells 330, look-ahead controller 416 initiates a strong refresh when look-ahead controller 416 determines that the number of look-ahead bit errors is equal to or greater than 16 bits.

The strong refresh includes reading out all of the data and look-ahead bits stored in resistive nonvolatile memory 200, correcting any correctable bit errors, replacing any bits that have uncorrectable errors, and writing all the data and look-ahead bits (including the corrected and replaced bits) back to resistive nonvolatile memory 200. Specifically, data and look-ahead bits that do not have errors are still refreshed in the strong refresh operation. When the stored look-ahead bits contain significant errors, thereby indicating data stored in data cells 310 also likely contains significant errors, data and look-ahead bits that do not have errors may still have lost significant memory cell margin and therefore may be close to failing. Accordingly, the strong refresh operation refreshes the entire data and look-ahead bits stored in resistive nonvolatile memory 200 in order to restore the margin within the memory cells storing the data and look-ahead bits. The strong refresh operation is discussed in greater detail below in reference to FIG. 6.

If the number of look-ahead bit errors is less than the threshold number of errors, look-ahead controller 416 initiates a weak refresh of the data stored in data cells 310. The weak refresh includes reading out all of the data and look-ahead bits stored in resistive nonvolatile memory 200, correcting any correctable bit errors, replacing any bits that have uncorrectable errors, and only writing the corrected/replaced data and look-ahead bits back to resistive nonvolatile memory 200. Accordingly, when the stored look-ahead bits do not contain significant errors, the memory system resources used to perform the refresh operation can be minimized by only writing corrected/replaced data and look-ahead bits instead of the entire resistive nonvolatile memory 200 of data and look-ahead bits. The weak refresh operation is discussed in greater detail below in reference to FIG. 7.

Figure 5:
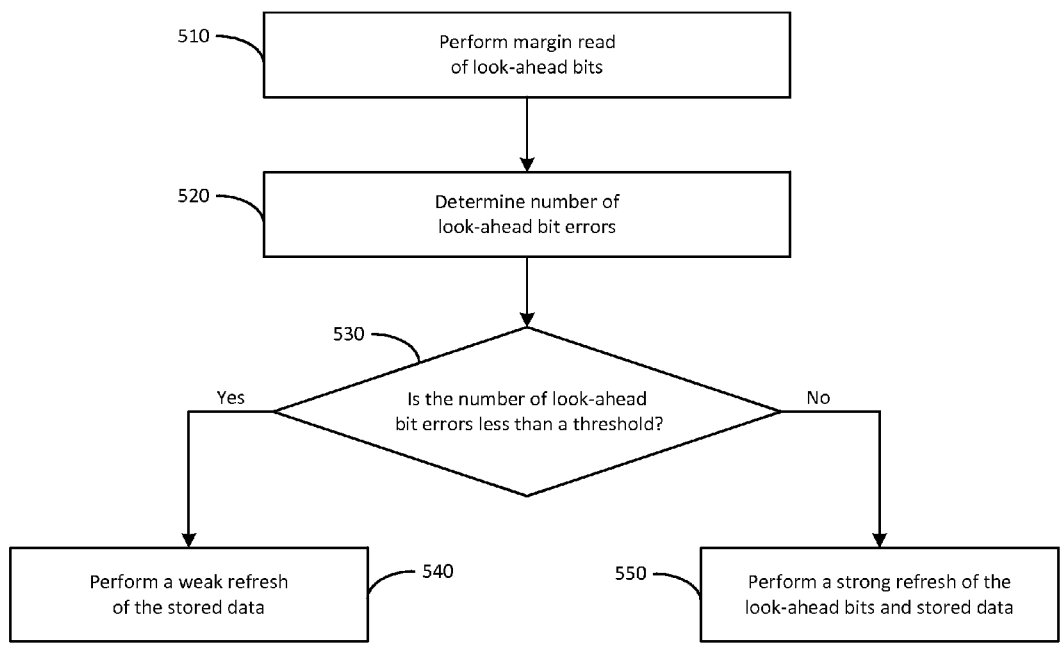
FIG. 5 is a flow diagram depicting an example method for correcting errors in a memory system consistent with embodiments of the present disclosure.

FIG. 5 depicts a flowchart of an example method 500, consistent with some embodiments and aspects of the present disclosure. Method 500 may be implemented, for example, for detecting and correcting errors in resistive nonvolatile memory. In some embodiments, method 500 may be implemented by a memory system such as, for example, memory system 400 illustrated in FIG. 4.

In some embodiments, example method 500 includes performing a margin read operation on look-ahead bits stored in a resistive nonvolatile memory array (510). A memory controller (e.g., memory controller 410 of FIG. 4) included in the memory system reads look-ahead bits stored in memory cells (e.g., in look-ahead cells 330 of FIG. 3) of a resistive memory array (e.g., resistive memory array 200 of FIGS. 2-4) using the margin read operation described above in reference to FIG. 4. The memory controller reads the look-ahead bits in various storage units such as pages, blocks, sectors, words, or any other storage unit known in the art. Each storage unit may include any number of look-ahead bits.

In some embodiments, example method 500 includes determining a number of errors among look-ahead bits stored in a resistive nonvolatile memory array (520). The memory controller reads ECC bits stored in memory cells (e.g., ECC cells 320 of FIG. 3) of the resistive memory array and uses the stored ECC bits to detect errors in the look-ahead bits. The memory controller detects errors by determining which look-ahead bits have flipped logical states (e.g., from a logical "1" to a logical "0" and vice-versa) due to high temperatures or EMI. The stored ECC bits may include Hamming codes, Bose, Chaudhuri, and Hocquenghem (BCH) codes, parity bits, Reed-Solomon codes, Turbo codes, low-density parity-check codes (LDPC), convolutional codes, or any other error correction codes known in the art.

In some embodiments, the memory controller detects errors among the stored look-ahead bits by comparing the stored look-ahead bits to a pattern. The memory controller writes the look-ahead bits to the resistive memory array in one of numerous patterns such as a checkerboard pattern of alternating logic states (e.g., 01010101). The memory controller is further programmed to read the patterned look-ahead bits and compare them to an expected pattern. Errors occur in the look-ahead bits when the readout pattern does not match the expected pattern.

The memory controller determines the number of look-ahead bit errors during various stages of memory system operation. For example, the memory controller may determine the number of look-ahead bit errors during a read cycle, in response to power up of the memory system, during an idle mode of the memory system, or in response to a received command. In the case of an idle mode, the memory controller may determine the number of look-ahead bit errors during a single idle mode or during a predetermined number of idle modes. Accordingly, the memory controller performs the error detection when impact to system performance is minimal. In the case of a power up, the memory controller may determine the number of look-ahead bit errors in response to a single power up or a predetermined number of power ups. The predetermined number of power ups may be determined using various criteria. For example, the number of power ups may be determined based on the expected number of power cycles the memory system will experience during production testing. Accordingly, any systematic defects in data that is preloaded into the memory system during production can be automatically corrected before being shipped from a production facility. In the case of a received command, the memory system may receive the command from a processing system communicatively coupled to the memory system, from a user such as a system operator or test technician/engineer, and/or from a test system such as a development or production test system. The command may be a command to perform error detection and correction, a read command, a system reset command, a power-on reset (POR) command, or a wake-up command.

In some embodiments, the memory controller includes a look-ahead controller (e.g., look-ahead controller 416 of FIG. 4) that determines a number of errors among the look-ahead bits stored in the resistive nonvolatile memory array. For example, the look-ahead controller reads the look-ahead bits from the resistive memory array and determines the number of errors among the look-ahead bits.

In some embodiments, example method 500 includes comparing the number of look-ahead bit errors to a threshold number of look-ahead bit errors (530). The threshold may be determined based on a number of factors including, for example, reliability requirements of the memory system, safety requirements, customer requirements, availability of memory system resources, the size of the resistive memory array, etc. An example threshold number of look-ahead bit errors is 50% of the look-ahead bits stored in look-ahead cells of the resistive nonvolatile memory array. When the memory controller determines that the number of look-ahead bit errors is less than the threshold number of look-ahead bit errors (530-yes), the memory controller performs a weak refresh of only storage units of data having data bit errors (540). When the memory controller determines that the number of look-ahead bit errors is equal to or greater than the threshold number of look-ahead bit errors (530-no), the memory controller performs a strong refresh of all look-ahead bits and data stored in the resistive nonvolatile memory array (550).

Figure 6:
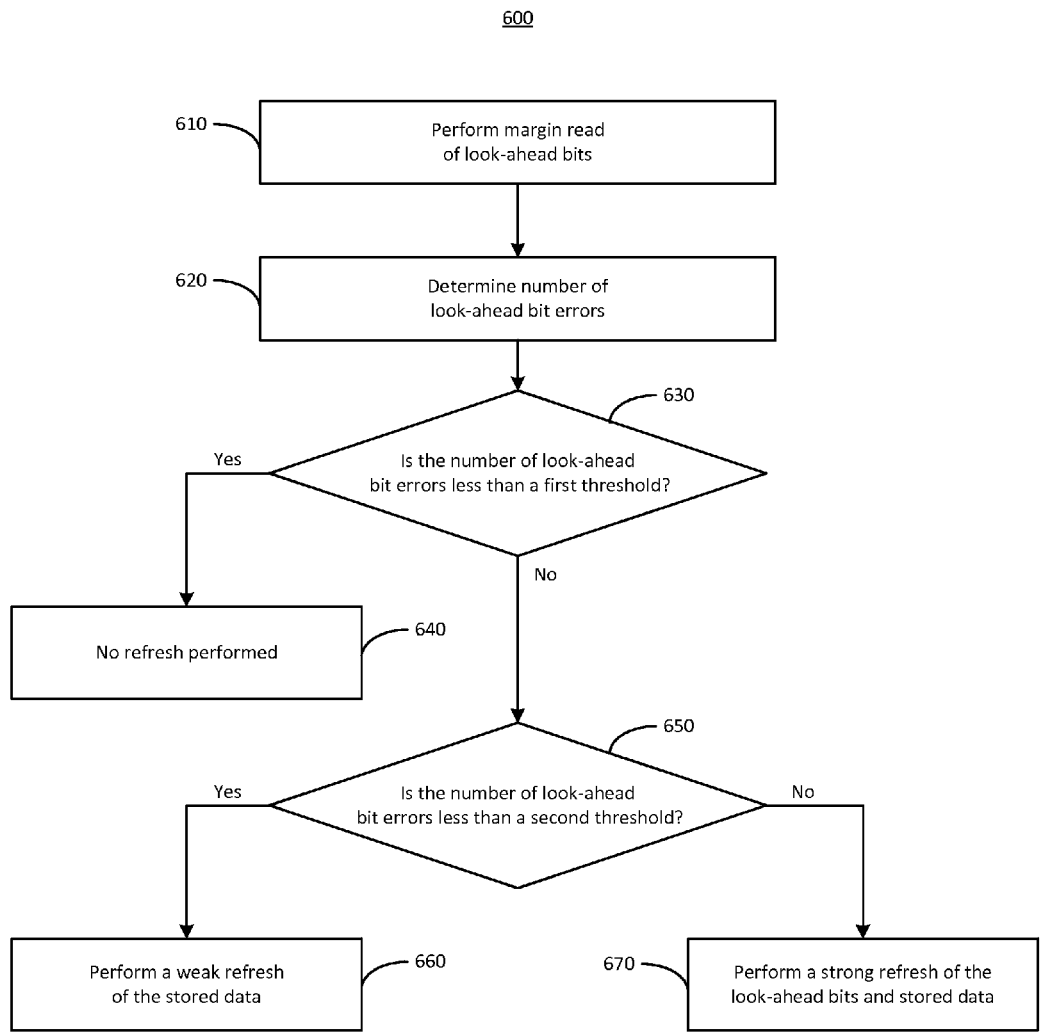
FIG. 6 is a flow diagram depicting another example method for correcting errors in a memory system consistent with embodiments of the present disclosure.

FIG. 6 depicts a flowchart of an example method 600, consistent with some embodiments and aspects of the present disclosure. Method 600 may be implemented, for example, for detecting and correcting errors in resistive nonvolatile memory. In some embodiments, method 600 may be implemented by a memory system such as, for example, memory system 400 illustrated in FIG. 4.

Similar to example method 500, example method 600 includes performing a margin read operation on look-ahead bits stored in a resistive nonvolatile memory array (610) and determining a number of errors among look-ahead bits stored in the resistive nonvolatile memory array (620). In some embodiments, example method 600 includes comparing the number of look-ahead bit errors to a first threshold number of look-ahead bit errors (630). When the memory controller determines that the number of look-ahead bit errors is less than the first threshold number of look-ahead bit errors (630-yes), the memory controller does not perform a refresh operation (640). When the memory controller determines that the number of look-ahead bit errors is equal to or greater than the first threshold number of look-ahead bit errors (630-no), the memory controller compares the number of look-ahead bit errors to a second threshold number of look-ahead bit errors (650). The second threshold number of look-ahead bit errors is greater than the first threshold. The memory controller performs a weak refresh of the data stored in the resistive nonvolatile memory array (650) when the number of look-ahead bit errors is less than the second threshold number of look-ahead bit errors (650-yes) and performs a strong refresh of all look-ahead bits and data stored in the resistive nonvolatile memory array (670) when the number of look-ahead bit errors is equal to or greater than the second threshold number of look-ahead bit errors (650-no).

When upper and lower look-ahead bit thresholds are used, the memory system uses fewer resources because the memory system is configured to accommodate a number of look-ahead bit errors below the first threshold. Accordingly, refresh operations are only performed if the look-ahead cells contain errors above the first threshold. The operator of the memory system can customize the first threshold based on a number of factors including, for example, reliability requirements of the memory system, safety requirements, customer requirements, availability of memory system resources, the size of the resistive memory array, etc.

Figure 7:
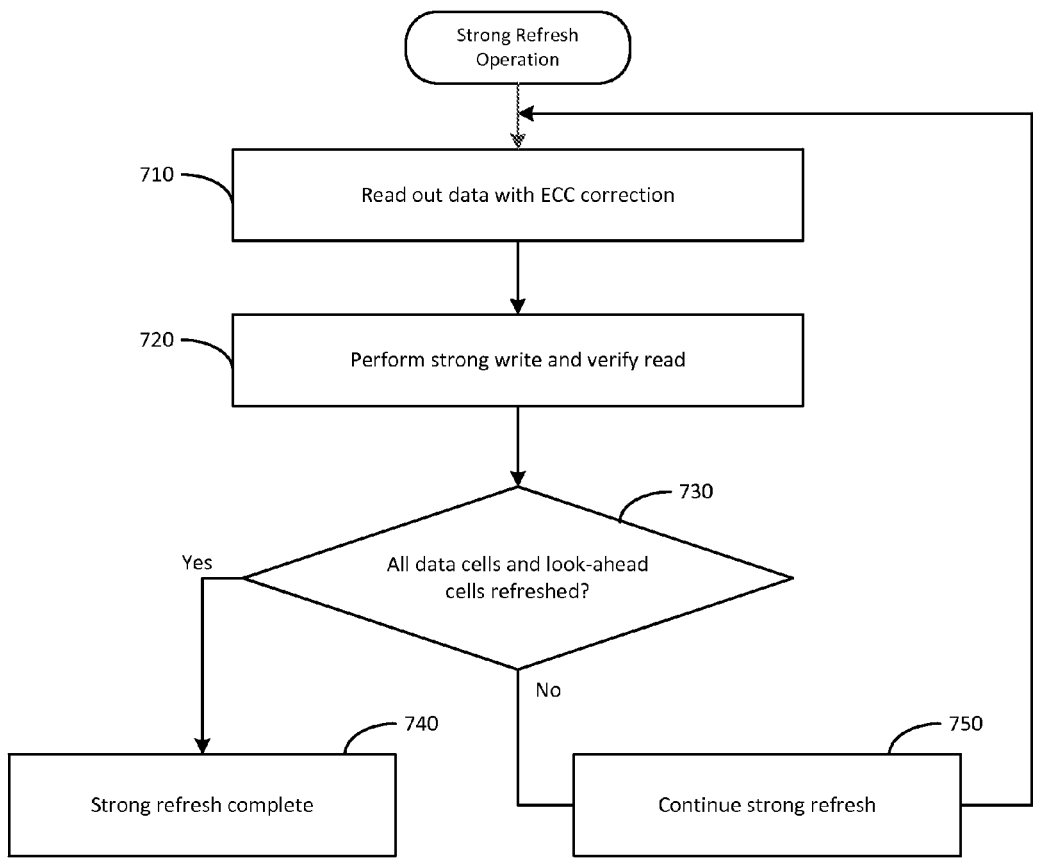
FIG. 7 is a flow diagram depicting an example method for performing a strong refresh operation consistent with embodiments of the present disclosure.

FIG. 7 depicts a flowchart of an example method 700, consistent with some embodiments and aspects of the present disclosure. Method 700 may be implemented, for example, for performing a strong refresh of all look-ahead bits and data stored in the resistive nonvolatile memory array. In some embodiments, method 700 may be implemented by a memory system such as, for example, memory system 400 illustrated in FIG. 4.

In some embodiments, example method 700 includes reading out data with ECC correction and detecting data bit errors among the data stored in a resistive nonvolatile memory array (710). A memory controller (e.g., memory controller 410 of FIG. 4) included in the memory system reads the data stored in memory cells (e.g., data cells 310 of FIG. 3) of a resistive memory array (e.g., resistive memory array 200 of FIGS. 2-4) using the normal read operation described above. The memory controller reads data in various storage units such as pages, blocks, sectors, words, or any other storage unit known in the art. Each storage unit may comprise any number of data bits. The memory controller further reads ECC bits stored in memory cells (e.g., ECC cells 320 of FIG. 3) of the resistive nonvolatile memory array and uses the stored ECC bits to detect data bit errors in the storage units of data. The memory controller detects data bit errors in the storage units of data by determining which data bits have flipped logical states (e.g., from a logical "1" to a logical "0" and vice-versa) due to high temperatures or EMI. The stored ECC bits may include Hamming codes, Bose, Chaudhuri, and Hocquenghem (BCH) codes, parity bits, Reed-Solomon codes, Turbo codes, low-density parity-check codes (LDPC), convolutional codes, or any other error correction codes known in the art.

The memory controller determines the number of data bit errors during various stages of memory system operation. For example, the memory controller may determine the number of data bit errors during a read cycle, in response to power up of the memory system, during an idle mode of the memory system, or in response to a received command. In the case of an idle mode, the memory controller may determine the number of data bit errors during a single idle mode or during a predetermined number of idle modes. Accordingly, the memory controller performs the error detection when impact to system performance is minimal. In the case of a power up, the memory controller may determine the number of data bit errors in response to a single power up or a predetermined number of power ups. The predetermined number of power ups may be determined using various criteria. For example, the number of power ups may be determined based on the expected number of power cycles the memory system will experience during production testing. Accordingly, any errors in data that are preloaded into the memory system during manufacturing can be automatically corrected before being shipped from a production facility. In the case of a received command, the memory system may receive the command from a processing system communicatively coupled to the memory system, from a user such as a system operator or test technician/engineer, and/or from a test system such as a development or production test system. The command may be a command to perform error detection and correction, a read command, a system reset command, a power-on reset (POR) command, or a wake-up command.

In some embodiments, the memory controller includes an ECC controller (e.g., ECC controller 415 of FIG. 4) that determines the number of data bit errors in the data stored in the resistive nonvolatile memory array. For example, the ECC controller reads the data and ECC bits from the resistive memory array and determines the number of data bit errors based on an ECC coding scheme.

In some embodiments, example method 700 includes performing a strong write of the data and look-ahead bits of the resistive nonvolatile memory array and verifying the written data with a verify read operation (720). The memory controller performs the strong write operation by writing the data and look-ahead bits back to the memory cells such that current distribution for the memory cells is greater than for a normal write cycle. To increase current distribution for a memory cell, the memory controller programs the logic value for that memory cell such that the current value read from the memory cell is further displaced from the threshold value than for a normal write cycle. Increasing current distribution within the memory cells requires additional write time and energy consumption by the memory controller but helps protect the data and look-ahead bits from becoming corrupted by increasing memory cell margin. Accordingly, increasing current distribution within the memory cells improves fault tolerance by making it more difficult for memory cells to flip logic states.

To perform the strong write operation, the memory controller determines a number of ECC bits needed to correct the data bit errors and/or look-ahead bit errors read from the resistive nonvolatile memory array. The number of ECC bits stored in the resistive nonvolatile memory array depends on the ECC coding scheme. For example, the ECC coding scheme may allocate a number of ECC bits per storage unit (e.g., per page, per block, per sector, per word, etc.). The number of ECC bits allocated to each storage unit may be flexible and depends on design requirements, system capabilities, timing and throughput requirements, etc. The memory controller or ECC controller determines the number of ECC bits allocated to each storage unit needed to correct the data bit errors in the storage unit. For example, five ECC bits are allocated to each address of data stored in the resistive nonvolatile memory array. Thus, in the example, the memory controller or ECC controller determines how many of the five ECC bits are needed to correct the data bit errors in the corresponding address of data. The memory controller or ECC controller further determines the number of ECC bits allocated to each look-ahead bit (or storage unit or look-ahead bits) needed to correct the look-ahead bit errors.

The memory controller or ECC controller determines whether the number of ECC bits needed to correct the data bit errors for each storage unit and/or the look-ahead bit is less than a threshold number of ECC bits. The threshold number of ECC bits is usually determined based on the error correction capacities of the ECC coding scheme implemented by the memory controller or ECC controller. However, other factors may be considered when determining the threshold number of ECC bits.

When it is determined that no ECC bits are needed to correct data errors in a storage unit or to correct a look-ahead bit error (i.e., that there are no data bit errors in the storage unit or no look-ahead bit error), then the memory controller reads the storage unit of data or the look-ahead bit and writes the storage unit or look-ahead bit back to the resistive nonvolatile memory array using a strong write operation (720). Reading data and look-ahead bits containing no errors and writing them back to the resistive nonvolatile memory array using the strong write operation increases the margin within the memory cells storing the data and look-ahead bits.

When is the memory controller determines that ECC bits are needed to correct data errors in a storage unit or to correct a look-ahead bit error, and the number of ECC bits needed is less than the threshold number of ECC bits, the memory controller or ECC controller corrects the errors and writes the corrected bits to the resistive nonvolatile memory array using the strong write operation. The memory controller or ECC controller corrects the errors by reversing the values of the data bits or look-ahead bit. Thus, for example, if a data cell or look-ahead cell includes a logical value of "0" and the memory controller or ECC controller determines the logical value is incorrect using the ECC bits, then the memory controller or ECC controller reverses the logical value to "1".

The memory controller writes the corrected bits to the resistive nonvolatile memory array by transmitting the corrected bits to a write circuit included in a sense amplifier and write driver (e.g., sense amplifier and write driver 414 of FIG. 4). The memory controller may write the corrected bits during various stages of memory system operation. For example, in one embodiment the memory controller performs the write in response to a subsequent power up of the memory system (e.g., the next power up) or during a subsequent idle mode of the memory system (e.g., the next idle mode). When the memory controller writes the corrected bits in response to a subsequent power up, the write is performed during power up initialization or shortly thereafter. Waiting to write the corrected bits until minimal system usage is minimal, such as in response to a power up or during an idle mode, minimizes impact to memory system performance.

When the memory controller determines that ECC bits are needed to correct data errors in a storage unit or to correct a look-ahead bit error, and the number of ECC bits needed is equal to or greater than the threshold number of ECC bits, the memory controller or ECC controller replaces the storage unit or the look-ahead bit. Replacing a storage unit of data or a look-ahead bit includes replacing the storage unit of data or the look-ahead bit with a corresponding storage unit of data or look-ahead bit stored in a transistor-based nonvolatile memory array. Transistor-based nonvolatile memory arrays include, for example, programmable read-only memory (PROM), flash memory, electrically erasable programmable read-only memory (EEPROM), or eFUSE memory.

The storage unit of data or look-ahead bit stored in the transistor-based nonvolatile memory array may be a copy (i.e., a backup storage unit or backup look-ahead bit) of the storage unit of data or look-ahead bit in the resistive nonvolatile memory array that is being replaced. The memory controller writes the data and look-ahead bits stored in the resistive memory array to the transistor-based nonvolatile memory array to create the backup storage units of data and look-ahead bits. The write may occur during various stages of memory system operation. For example the memory controller may write the data and look-ahead bits to the transistor-based nonvolatile memory array before a high-temperature thermal cycle (e.g., a board mount wave solder process), after the data and look-ahead bits are written to the resistive nonvolatile memory array, during an idle state of the memory system, in response to a received command, or in response to a power up of the memory system.

The memory controller reads the backup storage unit or backup look-ahead bit stored in the transistor-based nonvolatile memory array as part of the replacement process. In some embodiments, the memory controller controls both the resistive nonvolatile memory array and the transistor-based nonvolatile memory array. In such embodiments, the memory controller directly reads the data stored in the transistor-based nonvolatile memory array. In other embodiments, the transistor-based nonvolatile memory array is controlled by a separate memory controller. In such embodiments, the memory controller associated with the resistive nonvolatile memory array transmits a request to the memory controller associated with the transistor-based nonvolatile memory array. The memory controller associated with the transistor-based nonvolatile memory array receives the request, performs a read operation to retrieve the stored backup storage unit of data or backup look-ahead bit, and transmits the retrieved backup to the memory controller associated with the resistive nonvolatile memory array.

The memory controller writes the backup storage unit or backup look-ahead bit to the resistive nonvolatile memory array using the strong write operation. The memory controller replaces the storage unit of data or look-ahead bit at various stages of memory system operation. For example, the memory controller may replace the storage unit of data or look-ahead bit immediately after determining the number of ECC bits needed to correct the errors equals or exceeds the number of threshold ECC bits. As another example, the memory controller may replace the storage unit of data or look-ahead bit in response to a subsequent power up of the memory system (e.g., the next power up), or during a subsequent idle mode of the memory system (e.g., the next idle mode).

Once the strong write operation has been performed for the data bits or look-ahead bit, the memory controller verifies that the strong write operation has been performed successfully by performing a margin read operation described above in reference to FIG. 4. The margin read operation compares the current distribution of the written data or look-ahead bit with the upper and/or lower threshold current value to verify the current distribution of the written data or look-ahead bit has been increased. Once the memory controller verifies that the strong write operation has been performed successfully, the memory controller determines whether all data cells and look-ahead cells have been refreshed (730). If the memory controller determines that all data cells and look-ahead cells have been refreshed (730-Yes), then the strong refresh operation is complete (740). If the memory controller determines that some data cells or look-ahead cells still need to be refreshed (730-No), then the memory controller moves to the next data/look-ahead cell and continues the strong refresh operation (750).

Figure 8:
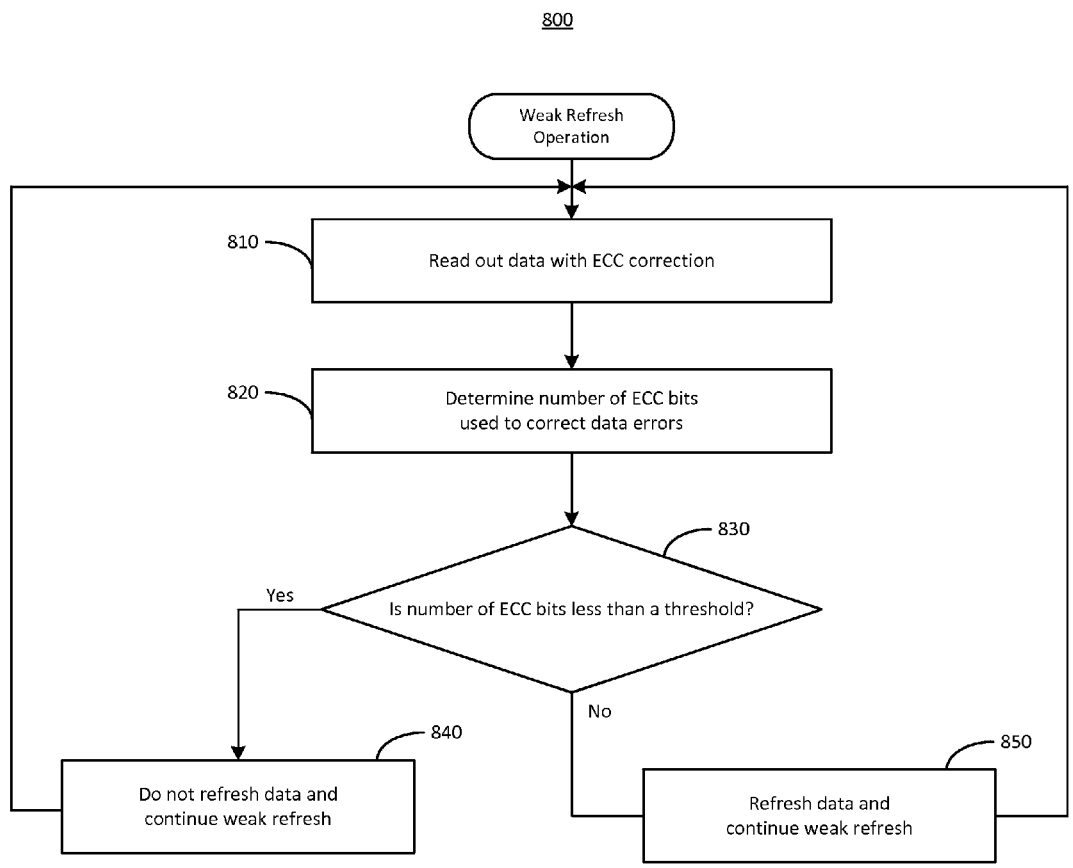
FIG. 8 is a flow diagram depicting an example method for performing a weak refresh operation consistent with embodiments of the present disclosure.

FIG. 8 depicts a flowchart of an example method 800, consistent with some embodiments and aspects of the present disclosure. Method 800 may be implemented, for example, for performing a weak refresh of the data stored in the resistive nonvolatile memory array. The weak refresh includes refreshing only storage unit of data having data bit errors. In some embodiments, method 800 may be implemented by a memory system such as, for example, memory system 400 illustrated in FIG. 4.

In some embodiments, method 800 includes reading out data with ECC correction and detecting data bit errors among the data stored in a resistive nonvolatile memory array (810). A memory controller (e.g., memory controller 410 of FIG. 4) included in the memory system reads the data stored in memory cells (e.g., data cells 310 of FIG. 3) of a resistive memory array (e.g., resistive memory array 200 of FIGS. 2-4). The memory controller reads data in various storage units such as pages, blocks, sectors, words, or any other storage unit known in the art. Each storage unit may comprise any number of data bits. The memory controller further reads ECC bits stored in memory cells (e.g., ECC cells 320 of FIG. 3) of the resistive memory array and uses the stored ECC bits to detect data bit errors in the stored data. The memory controller detects data bit errors in the storage units of data by determining which data bits have flipped logical states (e.g., from a logical "1" to a logical "0" and vice-versa) due to high temperatures or EMI. The stored ECC bits may include Hamming codes, Bose, Chaudhuri, and Hocquenghem (BCH) codes, parity bits, Reed-Solomon codes, Turbo codes, low-density parity-check codes (LDPC), convolutional codes, or any other error correction codes known in the art.

The memory controller detects the data bit errors during various stages of memory system operation. For example, the memory controller may detect the data bit errors during a read cycle, in response to power up of the memory system, during an idle mode of the memory system, or in response to a received command. In the case of an idle mode, the memory controller may detect the data bit errors during a single idle mode or during a predetermined number of idle modes. Accordingly, the memory controller performs the error detection when impact to system performance is minimal. In the case of a power up, the memory controller may detect the data bit errors in response to a single power up or a predetermined number of power ups. The predetermined number of power ups may be determined using various criteria. For example, the number of power ups may be determined based on the expected number of power cycles the memory system will experience during production testing. Accordingly, any defects in data that is preloaded into the memory system during manufacturing can be automatically corrected before being shipped from a production facility. In the case of a received command, the memory system may receive the command from a processing system communicatively coupled to the memory system, from a user such as a system operator or test technician/engineer, and/or from a test system such as a development or production test system. The command may be a command to perform error detection and correction, a read command, a system reset command, a power-on reset (POR) command, or a wake-up command.

In some embodiments, the memory controller includes an ECC controller (e.g., ECC controller 415 of FIG. 4) that detects the data bit errors in the data stored in the resistive nonvolatile memory array. For example, the ECC controller reads the data and ECC bits from the resistive memory array and detects the data bit errors based on an ECC coding scheme.

In some embodiments, method 800 includes determining a number of ECC bits needed to correct the data bit errors (820). The number of ECC bits stored in the resistive nonvolatile memory array depends on the ECC coding scheme. For example, the ECC coding scheme may allocate a number of ECC bits per storage unit (e.g., per page, per block, per sector, per word, etc.). The number of ECC bits allocated to each storage unit may be flexible and depends on design requirements, system capabilities, timing and throughput requirements, etc. The memory controller or ECC controller determines the number of ECC bits allocated to each storage unit needed to correct the data bit errors in the storage unit. For example, five ECC bits are allocated to each address of data stored in the resistive nonvolatile memory array. Thus, in the example, the memory controller or ECC controller determines how many of the five ECC bits are needed to correct the data bit errors in the corresponding address of data.

The memory controller or ECC controller determines whether the number of ECC bits needed to correct the data bit errors for each storage unit is less than a threshold number of ECC bits (830). For the weak refresh operation, the threshold number of ECC bits is selected to be less than the maximum ECC bit error correction capacities of the ECC coding scheme implemented by the memory controller or ECC controller. Since it has been determined that the stored look-ahead bits do not contain significant errors (520-yes), the memory system resources used to perform the weak refresh operation can be minimized by only writing data that have significant errors or corruption instead of writing the entire resistive nonvolatile memory of data.

When the memory controller determines that the number of ECC bits needed to correct data errors in a storage unit is less than the threshold (830-Yes), the memory controller and/or ECC controller does not perform a weak refresh of the data and continues to the next data cell (840).

When the memory controller determines that the number of ECC bits needed to correct data errors in a storage unit is greater than or equal to the threshold (830-No), and the number of ECC bits needed is less than the maximum ECC bits available for error correction, the memory controller or ECC controller performs a weak refresh write by correcting the errors and writing the corrected bits to the resistive nonvolatile memory array (850). The memory controller or ECC controller corrects the errors by reversing the values of the data bit errors. Thus, for example, if a data cell includes a logical value of "0" and the memory controller or ECC controller determines the logical value is incorrect using the ECC bits, then the memory controller or ECC controller reverses the logical value to "1".

The memory controller writes the corrected data bits to the resistive nonvolatile memory array using a normal write operation described above in reference to FIG. 4. The memory controller writes the corrected bits to the resistive nonvolatile memory array by transmitting the corrected bits to a write circuit included in a sense amplifier and write driver (e.g., sense amplifier and write driver 414 of FIG. 4). The memory controller may write the corrected bits during various stages of memory system operation. For example, in one embodiment the memory controller performs the write in response to a subsequent power up of the memory system (e.g., the next power up) or during a subsequent idle mode of the memory system (e.g., the next idle mode). When the memory controller writes the corrected bits in response to a subsequent power up, the write is performed during power up initialization or shortly thereafter. Waiting to write the corrected bits until minimal system usage is minimal, such as in response to a power up or during an idle mode, minimizes impact to memory system performance. In another embodiment, the memory controller performs the write immediately after correcting the data bit errors. Write times of resistive nonvolatile memory cells are typically much shorter than write times of transistor-based nonvolatile memory cells (e.g., flash memory cells). Since only storage units of data having data bit errors are written during a weak refresh, the weak refresh can be performed during normal memory system operation without adversely impacting memory system.

When the memory controller determines that the number of ECC bits needed to correct data errors in a storage unit is greater than or equal to the threshold (830-No), and the number of ECC bits needed is equal to or greater than the maximum ECC bits available for error correction, the memory controller or ECC controller performs a weak refresh write by replacing the storage unit (850). Replacing a storage unit of data includes replacing the storage unit of data with a corresponding storage unit of data stored in a transistor-based nonvolatile memory array. Transistor-based nonvolatile memory arrays include, for example, programmable read-only memory (PROM), flash memory, electrically erasable programmable read-only memory (EEPROM), or eFUSE memory.

The storage unit of data stored in the transistor-based nonvolatile memory array may be a copy (i.e., a backup storage unit) of the storage unit of data in the resistive nonvolatile memory array that is being replaced. The memory controller may write the data stored in the resistive memory array to the transistor-based nonvolatile memory array to create the backup storage units of data. The write may occur during various stages of memory system operation. For example the memory controller may write the data to the transistor-based nonvolatile memory array before a high-temperature thermal cycle (e.g., a board mount wave solder process), after the data are written to the resistive nonvolatile memory array, during an idle state of the memory system, in response to a received command, or in response to a power up of the memory system.

The memory controller reads the backup storage unit stored in the transistor-based nonvolatile memory array as part of the replacement process. In some embodiments, the memory controller controls both the resistive nonvolatile memory array and the transistor-based nonvolatile memory array. In such embodiments, the memory controller directly reads the data stored in the transistor-based nonvolatile memory array. In other embodiments, the transistor-based nonvolatile memory array is controlled by a separate memory controller. In such embodiments, the memory controller associated with the resistive nonvolatile memory array transmits a request to the memory controller associated with the transistor-based nonvolatile memory array. The memory controller associated with the transistor-based nonvolatile memory array receives the request, performs a read operation to retrieve the stored backup storage unit of data or backup look-ahead bit, and transmits the retrieved backup to the memory controller associated with the resistive nonvolatile memory array.

The memory controller writes the backup storage to the resistive nonvolatile memory array using the normal write operation described above in reference to FIG. 4. The memory controller replaces the storage unit of data at various stages of memory system operation. For example, the memory controller may replace the storage unit of data immediately after determining the number of ECC bits need to correct the errors equals or exceeds the number of threshold ECC bits. As another example, the memory controller may replace the storage unit of data in response to a subsequent power up of the memory system (e.g., the next power up), or during a subsequent idle mode of the memory system (e.g., the next idle mode).

Once the weak refresh operation has been performed for the data bits or look-ahead bit, the memory controller verifies that the weak refresh operation has been performed successfully by performing a margin read operation described above in reference to FIG. 4. The margin read for the weak refresh operation uses upper and lower threshold current values that are closer to a normal threshold current value than for the margin read of the strong write operation. Once the weak refresh operation is completed for the data cell (850), the memory controller and/or ECC controller moves to the next data cell and the weak refresh operation is continued.

Figure 9:
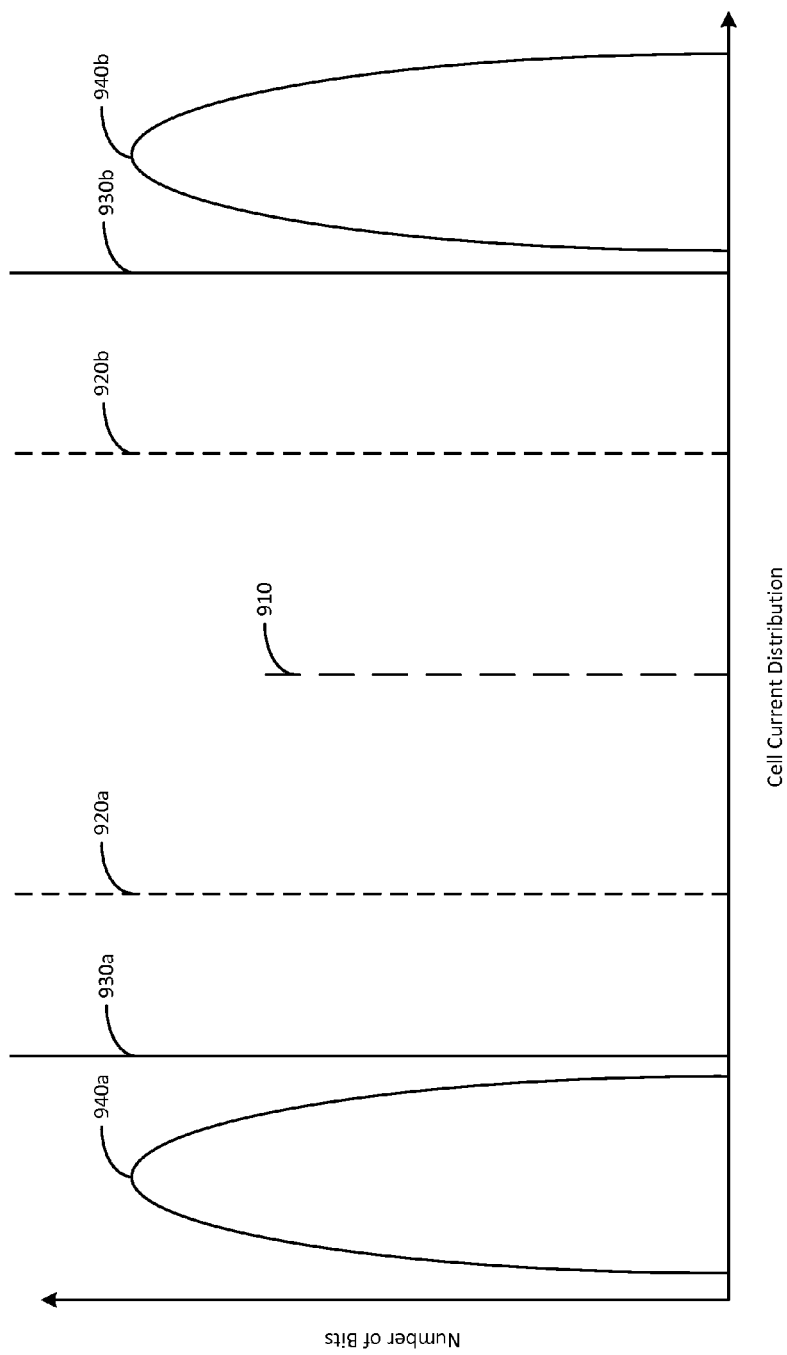
FIG. 9 illustrates a comparison between a normal read operation and a margin read operation consistent with embodiments of the present disclosure.

FIG. 9 illustrates a comparison between a normal read operation and a margin read operation consistent with embodiments of the present disclosure. As shown in FIG. 9, normal threshold current 910 divides the current distribution of a memory cell into two regions: an upper region and lower region. The upper region and lower regions correspond to different logic values (e.g., logic "0" and logic "1"). In a normal write operation, the memory controller (e.g., memory controller 410, FIG. 4) programs the memory cell so the cell's current distribution falls on either side of normal threshold current 910. In a normal read operation, the memory controller measures the current through the memory cell and compares it to normal threshold current 910 to determine the logic value of the memory cell.

In a weak refresh operation, the memory controller uses a lower weak threshold current 920a and an upper weak threshold current 920b as boundaries for the lower region and upper region, respectively. As shown in FIG. 9, lower weak threshold current 920a and upper weak threshold current 920b are distributed on either side of normal threshold current 910 such that there is margin between each of weak threshold current 920a and 920b and normal threshold current 910. In a weak refresh write, the memory controller programs the memory cell so the cell's current distribution is less than lower weak threshold current 920a or greater than upper weak threshold current 920b.

In a weak verify read operation (e.g., a margin read), the memory controller measures the current through the memory cell and compares it to lower weak threshold current 920a and upper weak threshold current 920b to determine the logic value of the memory cell.

In a strong refresh operation, the memory controller uses a lower strong threshold current 930a and an upper strong threshold current 930b as boundaries for the lower region and upper region, respectively. As shown in FIG. 9, lower strong threshold current 930a and upper strong threshold current 930b are distributed on either side of normal threshold current 910 such that there is margin between the two strong threshold currents 920a and 920b and normal threshold current 910. Moreover, lower strong threshold current 930a and upper strong threshold current 930b are distributed further away from normal threshold current 910 than lower weak threshold current 920a and upper weak threshold current 920b, respectively. In a strong refresh write, the memory controller programs the memory cell so the cell's current distribution is less than lower strong threshold current 930a or greater than upper strong threshold current 930b. Accordingly, the strong refresh write operation provides more memory cell margin than the weak refresh write operation.

In a strong verify read operation (e.g., a margin read), the memory controller measures the current through the memory cell and compares it to lower strong threshold current 930a and upper strong threshold current 930b to determine the logic value of the memory cell.

Strong threshold currents 930a and 930b can be used to detect shifts in a memory cell's current distribution. For example, a margin read operation using lower strong threshold current 930a and upper strong threshold current 930b can detect that a memory cell's current distribution has shifted closer to normal threshold current 910 and therefore that the quality of data stored in the memory cell is degrading. The early detection of data quality degradation is useful, for example, when using look-ahead bit errors as indicators of larger quantities of data because degradation in the quality of look-ahead bits indicates that the quality of corresponding data is also degrading and therefore should be refreshed.

FIG. 9 further illustrates example distribution curves 940a and 940b showing the number bits stored in a memory cell compared to the cell's current distribution. Distribution curves 940a and 940b are exemplary only and one skilled in the art will recognize that other distribution curves are possible.

In the preceding specification, various exemplary embodiments and aspects have been described with reference to the accompanying drawings. It will, however, be evident that various modifications and changes may be made thereto, and additional embodiments and aspects may be implemented, without departing from the broader scope of the invention as set forth in the claims that follow. The specification and drawings are accordingly to be regarded in an illustrative rather than restrictive sense.

The elements in the claims are to be interpreted broadly based on the language employed in the claims and not limited to examples described in the present specification or during the prosecution of the application, which examples are to be construed as non-exclusive. Further, one skilled in the art will understand from the above disclosure that the operations of the disclosed methods can be modified in any manner, including by reordering operations and/or inserting or deleting operations. It is intended, therefore, that the specification and examples be considered as example only, with a true scope and spirit being indicated by the following claims and their full scope of equivalents.

What is claimed is:

1. A memory system, comprising:
   a resistive nonvolatile memory array configured to store data bits and look-ahead bits, the look-ahead bits indicating a quality of the data bits stored in the nonvolatile memory array, and a total number of the look-ahead bits being fewer than a total number of the data bits; and
   a memory controller configured to:
      detect look-ahead bit errors among the stored look-ahead bits;
      detect a number of the detected look-ahead bit errors;
      compare the number of the detected look-ahead bit errors to a threshold number of bit errors;
      perform a strong refresh of the data bits and look-ahead bits stored in the resistive nonvolatile memory array when the number of the detected look-ahead bit errors equals or exceeds the threshold; and
      perform a weak refresh of the data bits and look-ahead bits by refreshing only units of stored data bits having data bit errors and look-ahead bits having look-ahead bit errors when the number of the detected look-ahead bit errors is less than the threshold.

2. The memory system of claim 1, wherein the resistive nonvolatile memory array comprises at least one of a phase change random access memory (PCRAM), a resistive random access memory (RRAM), or conductive-bridging random access memory (CBRAM).

3. The memory system of claim 1, wherein the memory controller is configured to detect the number of look-ahead bit errors in response to power up of the memory system, during an idle mode of the memory system, or in response to a received command.

4. The memory system of claim 3, wherein the memory controller is configured to detect the number of look-ahead bit errors in response to a predetermined number of power ups, during a predetermined number of idle modes, or in response to a predetermined number of received commands.

5. The memory system of claim 1, wherein:
   the resistive nonvolatile memory array is further configured to store error correction code (ECC) bits corresponding to units of stored data bits and look-ahead bits; and.
   the memory controller is further configured to:
      detect data bit errors in units of stored data bits,
      determine a number of ECC bits needed to correct the data bit errors and the look-ahead bit errors; and
      compare the number of ECC bits to a threshold number of ECC bits.

6. The memory system of claim 5, wherein the memory controller is further configured to perform the strong refresh by:
   correcting data bit errors in units of stored data bits and look-ahead bit errors and writing the corrected units of stored data bits and look-ahead bits to the resistive nonvolatile memory array when the number of ECC bits needed to correct the data bit errors and the look-ahead bit errors is greater than zero and less than the threshold number of ECC bits;

replacing units of stored data bits and look-ahead bits with corresponding units of data bits and look-ahead bits stored in a transistor-based nonvolatile memory array when the number of ECC bits needed to correct data bit errors in the units of stored data bits and the look-ahead bit errors is greater than the threshold number of ECC bits; and reading units of stored data bits having no data bit errors and look-ahead bits having no look-ahead bit errors and writing the units of stored data bits and the look-ahead bits back to the resistive nonvolatile memory array.

7. The memory system of claim 6, wherein the transistor-based nonvolatile memory array includes at least one of a programmable read-only memory (PROM), a flash memory, an electrically erasable programmable read-only memory (EEPROM), or an eFUSE memory.

8. The memory system of claim 6, wherein the memory controller is configured to perform the strong refresh by:
writing the corrected units of stored data bits and look-ahead bits, replacing defective units of stored data bits and look-ahead bits, and writing the units of stored data bits and look-ahead bits such that current distribution for the memory cells of the resistive nonvolatile memory array is greater than for the weak refresh.

9. The memory system of claim 5, wherein the memory controller is further configured to perform the weak refresh by:
correcting data bit errors in units of stored data bits and look-ahead bit errors and writing the corrected units of stored data bits and look-ahead bits to the resistive nonvolatile memory array when the number of ECC bits needed to correct the data bit errors and the look-ahead bit errors is greater than zero and less than the threshold number of ECC bits; and
replacing units of stored data bits and look-ahead bits with corresponding units of data bits and look-ahead bits stored in a transistor-based nonvolatile memory array when the number of ECC bits needed to correct data bit errors in the units of stored data bits and the look-ahead bit errors is greater than the threshold number of ECC bits.

10. The memory system of claim 1, wherein the memory controller is further configured to perform the strong refresh or weak refresh in response to a power up of the memory system or during an idle mode of the memory system.

11. The memory system of claim 1, wherein the data bits and look-ahead bits are respectively stored in different resistive nonvolatile memory arrays formed on a semiconductor die, stored in different resistive nonvolatile memory arrays formed on separate semiconductor dies included in an integrated circuit (IC) package, or stored in different resistive nonvolatile memory arrays formed on separate semiconductor dies included in separate IC packages.

12. A method for correcting errors in a memory system, comprising:
detecting look-ahead bit errors among look-ahead bits stored in a resistive nonvolatile memory array, the look-ahead bits indicating a quality of data bits stored in the resistive nonvolatile memory array, and a total number of the look-ahead bits being fewer than a total number of the data bits;
detecting a number of the detected look-ahead bit errors;
comparing the number of the detected look-ahead bit errors to a threshold number of bit errors;
performing a strong refresh of data bits and look-ahead bits stored in the resistive nonvolatile memory array when the number of the detected look-ahead bit errors equals or exceeds the threshold; and
performing a weak refresh of the data bits and look-ahead bits by refreshing only units of stored data bits having data bit errors and look-ahead bits having look-ahead bit errors when the number of the detected look-ahead bit errors is less than the threshold.

13. The method of claim 12, wherein the resistive nonvolatile memory array comprises at least one of a phase change random access memory (PCRAM), a resistive random access memory (RRAM), or conductive-bridge random access memory (CBRAM).

14. The method of claim 12, wherein detecting the number of errors among the look-ahead bits includes detecting the number of errors among the look-ahead bits in response to power up of the memory system, during an idle mode of the memory system, or in response to a received command.

15. The method of claim 12, wherein detecting the number of errors among the look-ahead bits includes detecting the number of errors among the look-ahead bits in response to a predetermined number of power ups, during a predetermined number of idle modes, or in response to a predetermined number of received commands.

16. The method of claim 12, further comprising:
detecting data bit errors in units of stored data bits;
determining a number of error correction code (ECC) bits needed to correct the data bit errors and the look-ahead bit errors, the ECC bits stored in the resistive nonvolatile memory array and corresponding to units of stored data bits and look-ahead bits; and
comparing the number of ECC bits to a threshold number of ECC bits.

17. The method of claim 16, wherein performing the strong refresh includes:
correcting data bit errors in units of stored data bits and look-ahead bit errors and writing the corrected units of stored data bits and look-ahead bits to the resistive nonvolatile memory array when the number of ECC bits needed to correct the data bit errors and the look-ahead bit errors is greater than zero and less than the threshold number of ECC bits;
replacing units of stored data bits and look-ahead bits with corresponding units of data bits and look-ahead bits stored in a transistor-based nonvolatile memory array when the number of ECC bits needed to correct data bit errors in the units of stored data bits and the look-ahead bit errors is greater than the threshold number of ECC bits; and
reading, from the resistive nonvolatile memory array, units of stored data bits having no data bit errors and look-ahead bits having no look-ahead bit errors and writing the units of stored data bits having no data bit errors and the look-ahead bits having no look-ahead bit errors back to the resistive nonvolatile memory array.

18. The method of claim 17, wherein the transistor-based nonvolatile memory array includes at least one of a programmable read-only memory (PROM), a flash memory, an electrically erasable programmable read-only memory (EEPROM), or an eFUSE memory.

19. The method of claim 17, wherein performing the strong refresh includes:
writing the corrected units of stored data bits and look-ahead bits, replacing units of stored data bits and look-ahead bits, and writing the units of stored data bits having no data bit errors and look-ahead bits having no look-ahead bit errors such that current distribution for the memory cells of the resistive nonvolatile memory array is greater than for the weak refresh.

20. The method of claim 12, wherein performing the weak refresh includes:
correcting data bit errors in units of stored data bits and look-ahead bit errors and writing the corrected units of stored data bits and look-ahead bits to the resistive nonvolatile memory array when the number of ECC bits needed to correct the data bit errors and the look-ahead bit errors is greater than zero and less than the threshold number of ECC bits; and
replacing units of stored data bits and look-ahead bits with corresponding units of data bits and look-ahead bits stored in a transistor-based nonvolatile memory array when the number of ECC bits needed to correct data bit errors in the units of stored data bits and the look-ahead bit errors is greater than the threshold number of ECC bits.

21. The method of claim 12, wherein performing the strong refresh or weak refresh includes performing the strong refresh or weak refresh in response to a power up of the memory system or during an idle mode of the memory system.

22. The method of claim 12, wherein the data bits and look-ahead bits are respectively stored in different resistive nonvolatile memory arrays formed on a semiconductor die, stored in different resistive nonvolatile memory arrays formed on separate semiconductor dies included in an integrated circuit (IC) package, or stored in different resistive nonvolatile memory arrays formed on separate semiconductor dies included in separate IC packages.

23. A memory system, comprising:
a nonvolatile memory array, comprising:
resistive memory cells configured to store data bits,
resistive memory cells configured to store error correction code (ECC) bits, the ECC bits for correcting data bit errors in units of the stored data bits, and
resistive memory cells configured to store look-ahead bits, the look-ahead bits for detecting systematic drift of the stored data bits stored in the resistive memory cells, a total number of the look-ahead bits being fewer than a total number of the data bits; and
a memory controller configured to:
detect look-ahead bit errors among the stored look-ahead bits,
detect systematic drift of the stored data bits based on the detected look-ahead bit errors, and
correct the data bit errors and look-ahead bit errors.

* * * * *